US009989433B2

(12) United States Patent
Cavalloni et al.

(10) Patent No.: US 9,989,433 B2
(45) Date of Patent: Jun. 5, 2018

(54) PIEZOELECTRIC MEASURING ELEMENT FOR MEASURING THE DYNAMIC AND STATIC PRESSURE AND/OR THE TEMPERATURE

(71) Applicant: KISTLER HOLDING AG, Winterthur (CH)

(72) Inventors: Claudio Cavalloni, Regensdorf (CH); Roland Sommer, Neftenbach (CH)

(73) Assignee: KISTLER HOLDING AG, Winterthur (CH)

( * ) Notice: Subject to any disclaimer, the term of this patent is extended or adjusted under 35 U.S.C. 154(b) by 157 days.

(21) Appl. No.: 15/122,714

(22) PCT Filed: Mar. 20, 2015

(86) PCT No.: PCT/CH2015/000044
§ 371 (c)(1),
(2) Date: Aug. 31, 2016

(87) PCT Pub. No.: WO2015/139149
PCT Pub. Date: Sep. 24, 2015

(65) Prior Publication Data
US 2017/0074741 A1    Mar. 16, 2017

(30) Foreign Application Priority Data
Mar. 21, 2014  (CH) ........................... 0434/14

(51) Int. Cl.
*G01L 15/00*    (2006.01)
*G01L 5/16*    (2006.01)
(Continued)

(52) U.S. Cl.
CPC .............. *G01L 15/00* (2013.01); *G01K 11/26* (2013.01); *G01L 1/16* (2013.01); *G01L 5/167* (2013.01);
(Continued)

(58) Field of Classification Search
CPC ........ G01L 5/167; G01L 9/0022; G01L 15/00; G01L 1/16; G01L 1/162; G01L 9/008;
(Continued)

(56) References Cited

U.S. PATENT DOCUMENTS 4,546,658 A * 10/1985 Rocha ....................... G01L 1/16
310/323.21
9,291,512 B2   3/2016 Schricker et al.
(Continued)

FOREIGN PATENT DOCUMENTS

AT         503 558 A4    11/2007
EP       1 111 360 A2     6/2001
(Continued)

OTHER PUBLICATIONS

PCT/CH2015/000044, International Preliminary Report on Patentability, dated Sep. 21, 2016.*
PCT/CF12015/090044, International Preliminary Report on Patentability, dated Sep. 21, 2016.
International Search Report, dated Apr. 15, 2015.

*Primary Examiner* — Blake A Tankersley
(74) *Attorney, Agent, or Firm* — Dority & Manning, P.A.

(57) ABSTRACT

A measuring element for measuring dynamic pressure, temperature and/or static pressure includes a body made of a piezoelectric material and having opposing side surfaces carrying electrodes. The piezoelectric material of the body is selected in such a manner that a thrust coefficient of the piezoelectric e-tensor is not equal to zero, with the result that the inverse piezoelectric effect can be used, and a transverse coefficient of the piezoelectric d-tensor is not equal to zero and/or a longitudinal coefficient of the piezoelectric d-tensor is not equal to zero, with the result that the transverse piezoelectric effect can be used in the transverse direction and/or the longitudinal piezoelectric effect can be used in the longitudinal direction in a simultaneous manner with the inverse piezoelectric effect.

19 Claims, 4 Drawing Sheets

(51) Int. Cl.
*G01L 9/00* (2006.01)
*G01L 1/16* (2006.01)
*H01L 41/113* (2006.01)
*G01K 11/26* (2006.01)

(52) U.S. Cl.
CPC ............ *G01L 9/008* (2013.01); *G01L 9/0022* (2013.01); *H01L 41/1132* (2013.01)

(58) Field of Classification Search
CPC ....... G01L 9/08; G01L 9/085; H01L 41/1132; G01K 11/26
See application file for complete search history.

(56) References Cited

U.S. PATENT DOCUMENTS

| 2004/0237629 | A1 | 12/2004 | Lenzing et al. |
| 2009/0025482 | A1 | 1/2009 | Holzheu |
| 2014/0216175 | A1* | 8/2014 | Schricker ................ G01L 9/008 73/862.629 |
| 2016/0290879 | A1* | 10/2016 | Kohler ..................... G01L 1/16 |

FOREIGN PATENT DOCUMENTS

| EP | 2 023 113 A2 | 2/2009 |
| WO | WO 2012/164016 A2 | 12/2012 |

\* cited by examiner

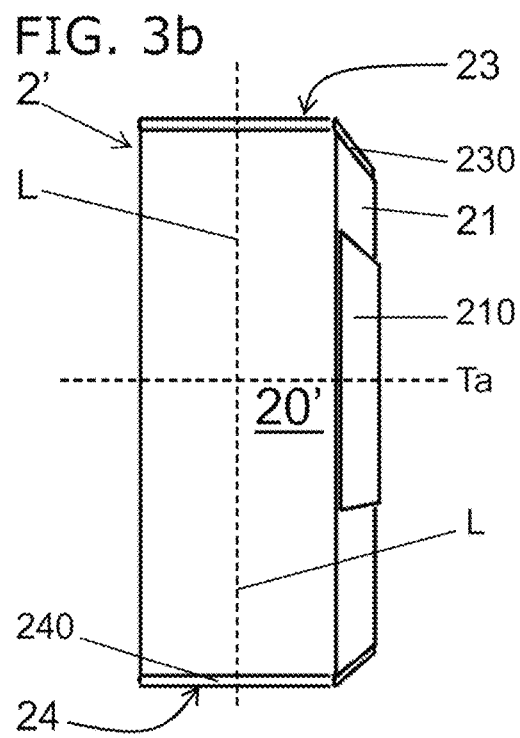
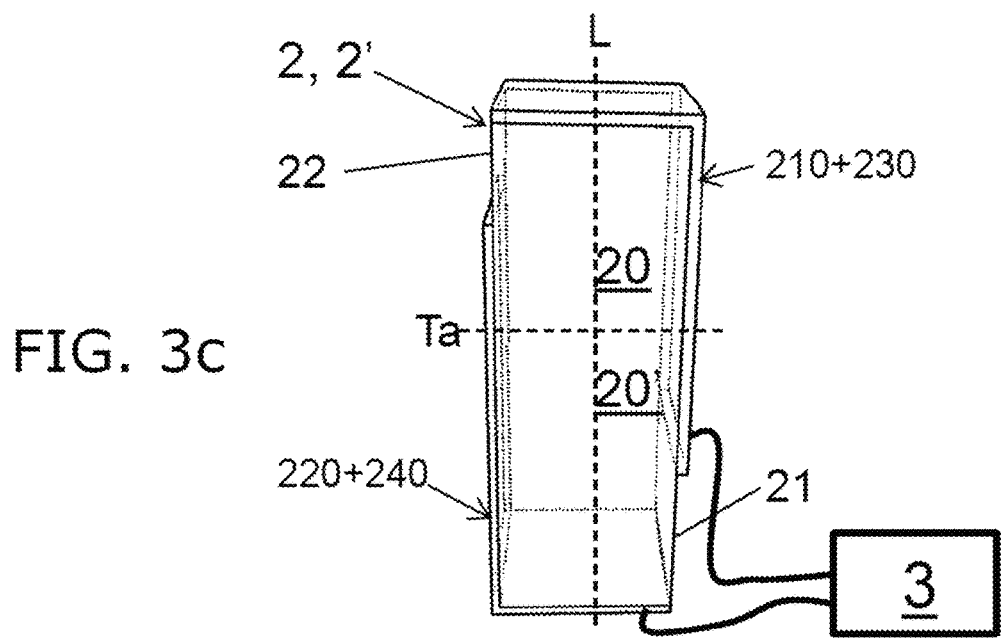

PIEZOELECTRIC MEASURING ELEMENT FOR MEASURING THE DYNAMIC AND STATIC PRESSURE AND/OR THE TEMPERATURE

CROSS-REFERENCE TO RELATED APPLICATIONS

This application claims priority to International Application Serial No. PCT/CH2015/000044, filed Mar. 20, 2015, which claims priority to Swiss Application No. 00434/14, filed Mar. 21, 2014. International Application Serial No. PCT/CH2015/000044 is hereby incorporated herein in its entirety for all purposes by this reference.

FIELD OF THE INVENTION

The present invention describes a measuring element for measuring the dynamic pressure and additionally for measuring the temperature and/or the static pressure, with said measuring element comprising a body made of a piezoelectric material, wherein the body has lateral faces that are arranged opposite of one another in a transverse direction and on each of which assigned lateral face electrodes are arranged, and wherein the measuring element can be arranged in a measuring element mounting in the longitudinal direction in a prestressed fashion in order to utilize the piezoelectric effect and subjected to a force, a sensor structure with a measuring element, as well as a method for measuring the static and dynamic pressure and/or the temperature with a measuring element comprising a piezoelectric body that is clamped in a measuring element receptacle in the longitudinal direction, wherein the piezoelectric body has lateral faces that are spaced apart from one another in a transverse direction and on which lateral face electrodes are arranged.

BACKGROUND

Due to their special properties, measuring elements comprising piezoelectrics or piezoelectric bodies are used in a number of sensor structures with measuring elements.

US Patent Application Publication No. 2012-0216175 A1, which is hereby incorporated herein by this reference for all purposes, discloses a sensor structure that consists of a plurality of measuring elements comprising multiple bodies of piezoelectric materials. The measuring elements can be used for measuring pressures and/or forces. The sensor structure has a compact design, wherein the measuring elements of piezoelectric material are arranged upright in a housing in a prestressed fashion and spaced apart from one another in order to utilize the piezoelectric effect for a dynamic force or pressure measurement. Forces are transmitted to the end faces of the measuring elements via a diaphragm. Measuring signals for determining the respective force or pressure are recorded in dependence on the strain of the measuring elements. At least one additional measuring element is provided for recording static force or pressure values, wherein this additional measuring element utilizes the inverse piezoelectric effect and is operated in the form of a thickness shear oscillator. This thickness shear oscillator is operated in the form of a piezoelectric resonator and incited to oscillate accordingly with an electronic excitation signal by means of electrodes applied to the lateral faces of the measuring element. The resonant frequency of the thickness shear oscillator changes in dependence on the force or pressure acting thereupon, wherein this can be used for respectively determining the static force or the pressure.

Numerous components are required for assembling such a sensor structure and have to be exactly oriented and mounted in the housing, as well as electrically wired with great care, such that the different measuring elements are not disturbed by the incited high-frequency oscillations of the other measuring elements and the excitation voltage of the electronic system used. As a result of the constructive design, the measuring elements are locally spaced apart such that the placement and the contacting of the measuring elements in the housing are in fact simplified, but force and/or pressure measurements consequently take place at locally different points and therefore lead to measuring inaccuracies.

AT503558 describes a different approach for carrying out a force or pressure measurement as close as possible to a location in a reproducible fashion and for improving the measuring accuracy. A measuring element comprising a body made of a piezoelectric material is provided with an additional second measuring element consisting of a piezoelectric measuring lamina with a so-called SAW (Surface Acoustic Wave) structure. The measuring element conventionally delivers the predominant dynamic pressure by utilizing the piezoelectric effect. An additionally compacted sensor structure is achieved because the SAW structure is arranged on the body made of piezoelectric material such that it directly contacts the measuring element. The measuring element features surface electrodes that likewise have to be mounted on the measuring element and tuned to the SAW structure before the surface electrodes and the SAW structure can be connected to an electronic evaluation and excitation system.

In the measuring mode, the electronic evaluation and excitation system generates surface waves in the form of acoustic waves along the SAW structure, wherein the transit times of these acoustic waves change in dependence on the force acting upon the measuring element and the SAW structure. The absolute pressure can be determined from the change of the transit times by means of the SAW structure.

Although fixing the SAW structure on the measuring element leads to a multipart sensor structure that respectively allows a pressure or force measurement at nearly the same location, inhomogeneous force distributions in the measuring element and in the SAW structure occur as a result. In the mounting of the SAW structure on the measuring element, as well as in the arrangement of the surface electrodes on the measuring element, it must be ensured that neither the two independent piezoelectric elements, nor the measuring signals originating from these two piezoelectric elements, disturb one another. In order to realize the sensor structure according to AT 503558, the measuring element has to be exactly connected to the piezoelectric measuring lamina with the SAW structure in an elaborate and therefore cost-intensive manufacturing step.

BRIEF SUMMARY OF THE INVENTION

The present invention is based on the objective of respectively developing a measuring element and a sensor structure that are constructed in a simpler and more cost-effective fashion using only a few components, wherein a more accurate dynamic and static force and/or pressure measurement and/or temperature measurement can be carried out than with measuring elements according to the prior art.

This objective is attained in that the sensor structure features only one measuring element that comprises a body of a suitable piezoelectric material and can be simultaneously operated in two measuring modes. Since the measuring element is manufactured in one piece and only comprises one piezoelectric body, the placement and the electric contacting are significantly simplified and the force or pressure measurement or temperature measurement takes place at one location in both measuring modes.

BRIEF DESCRIPTION OF THE DRAWINGS

The object of the invention is described in an exemplary fashion below with reference to the attached drawings.

FIG. 1a shows a section through a sensor structure with a measuring element comprising a piezoelectric body, the piezoelectric effect and inverse piezoelectric effect of which can be simultaneously utilized for the acquisition of measuring values, whereas FIG. 1b shows a perspective view of a suitable measuring element according to FIG. 1a.

FIG. 3a shows a section through a sensor structure with a measuring element comprising a piezoelectric body, the piezoelectric effect and inverse piezoelectric effect of which can be simultaneously utilized for the acquisition of measuring values during its operation in the form of a thickness shear oscillator, whereas FIGS. 3b and 3c show perspective views of potential designs of measuring elements suitable for operating in a sensor structure according to FIG. 3a, wherein the electronic evaluation and excitation system is also indicated in FIG. 3c.

FIG. 4a shows a schematic perspective view of a monocrystal with a principal axis, wherein a piezoelectric body is cut in a plane that is angled relative to the principal axis, whereas

DESCRIPTION OF EXEMPLARY
EMBODIMENTS OF THE INVENTION

Figure 1A:
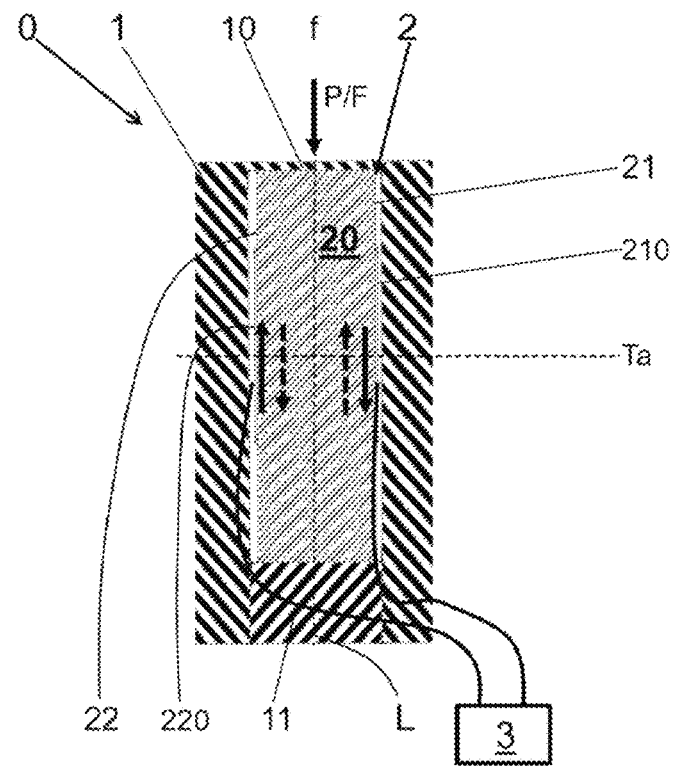

As shown in FIG. 1a for example, an embodiment of the described measuring element 2 can be mounted in a sensor structure 0 and used for measuring the dynamic and/or static pressure and/or the temperature, for example in an arrangement in a combustion chamber of an engine. The sensor structure 0 is composed of the measuring element 2 and a measuring element mounting 1.

The measuring element 2 features a one-piece body 20 that is made of a piezoelectric material and mounted in the measuring element mounting 1 in a positionally stable fashion such that the measuring element 2 or the body 20 can respectively absorb forces in the measuring mode. For this purpose, the measuring element 2 is separably or inseparably clamped in the measuring element mounting 1 along a longitudinal direction L in a form-fitting and/or frictionally engaged fashion.

In this case, the measuring element mounting 1 features a diaphragm 10 and an abutment 11, between which the body 20 is clamped. Forces F acting upon the body 20 in the longitudinal direction L can be determined during the operation of the measuring element 2, wherein the predominant pressure P can in turn be determined from these forces. The body 20 features a first lateral face 21, on which a first lateral face electrode 210 is arranged. A second lateral face electrode 220 is arranged on a second lateral face 22 that lies opposite of the first lateral face 21 in a transverse direction Ta. A voltage signal or a charge signal can be measured on an electronic evaluation and excitation system 3 when a force or pressure acts upon the body 20 in the longitudinal direction L. The electronic evaluation and excitation system 3 is connected to both lateral face electrodes 210, 220 via supply lines.

The proposed measuring element 2 is designed for simultaneously operating in two measuring modes. In a first measuring mode, the dynamic pressure can be measured by utilizing the piezoelectric (or direct piezoelectric) effect in the form of the transverse effect. In a second measuring mode, the static pressure can be simultaneously measured with the same measuring element 2 by utilizing the inverse piezoelectric effect, i.e. by operating the measuring element 2 in the form of a thickness shear oscillator. The electronic excitation of the body 20 with a thickness shear oscillation frequency f is likewise realized with the electronic evaluation and excitation system 3 connected to the lateral face electrodes 210, 220. The thickness shear oscillations take place parallel to the longitudinal direction or transverse thereto and is indicated with arrows, but described in greater detail below with reference to FIG. 2. In this case, only two supply lines leading to the electronic evaluation and excitation system 3 are required because the thickness shear oscillations are incited and the charge measurement takes place at the lateral face electrodes 210, 220 due to the transverse effect.

Figure 1B:
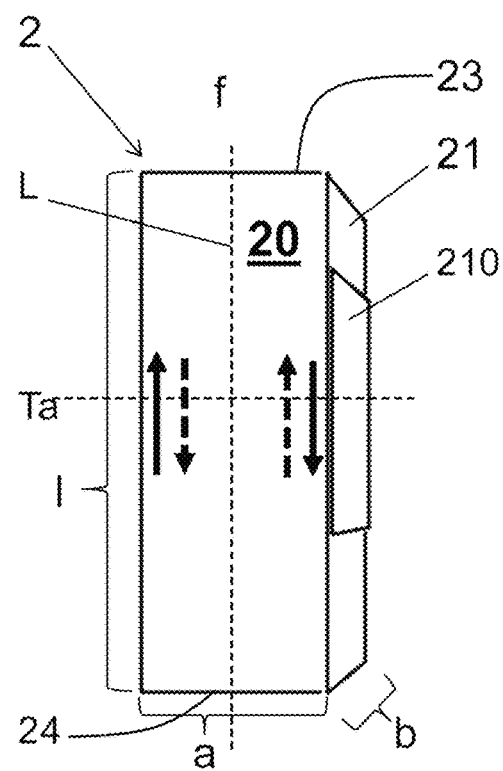

According to FIG. 1b, the body 20 has a length l extending between a first end face 23 and a second end face 24, a thickness a extending in the transverse direction Ta, as well as a width b. In this case, the length l is much greater than each of the width b and the thickness a such that the body 20 has a rod-shaped design. Due to the perspective representation, only the first lateral face 21 with the first lateral face electrode 210 is visible in this figure. The second lateral face 22 and the second lateral face electrode 220 are obscured. The lateral face electrodes 210, 220 are flatly arranged on the lateral faces 21, 22, wherein a full-surface arrangement may be advantageous in order to improve the measuring results. However, the lateral face electrodes 210, 220 also may only cover the lateral faces 21, 22 partially and be realized with a partially round or elliptically shaped surface area.

The body 20 of the measuring element 2 is made of a piezoelectric material that makes it possible to simultaneously utilize both piezoelectric effects.

It is well known that the piezoelectricity in a piezoelectric material, in this case in the body 20, is described in the form of piezoelectric tensors with piezoelectric coefficients.

A piezoelectric d-tensor dijk, which is a tensor of the third order, describes the strain S of the body 20 generated as a result of an applied electric field E or the generated electric displacement field D of the body 20 as a function of the mechanical state of stresses T.

The d-tensor dijk is defined in the form of $$d_{ijk} = \frac{\partial D_i}{\partial T_{jk}} = \frac{\partial S_{jk}}{\partial E_i}, i = 1 \ldots 3, j = 1 \ldots 3$$

wherein D is the vector of the electric displacement field, T is the stress tensor, S is the strain tensor and E is the vector of the electric field.

In this case, the piezoelectric effect is in the first measuring mode utilized in the transverse direction Ta, wherein the forces F act upon the body 20 in the direction extending parallel to the longitudinal axis L. A polarization occurs as a result of the displacement of ions in the piezoelectric material because the charge concentrations of the negative and positive charges in each unit cell of the piezoelectric material are displaced relative to one another. A voltage or charge can then be measured in the transverse direction Ta.

The transverse effect can be utilized if the material of the piezoelectric body 20 is chosen in such a way that the piezoelectric d-tensor dijk has a transverse coefficient dijj other than zero, wherein a charge transfer in the transverse direction Ta, which extends orthogonal to the longitudinal axis L, results under the influence of an external force F acting in the direction of the longitudinal axis L. In order to utilize the piezoelectric effect in the form of the transverse effect such that forces F acting upon the end faces 23, 24 in the direction of the longitudinal axis L lead to the generation of electric voltages, the body 20 must have a transverse sensitivity other than zero in the direction extending perpendicular to the longitudinal axis L.

Consequently, the body 20 or the piezoelectric material respectively must be chosen such that the piezoelectric d-tensor dijk has a transverse coefficient dijj other than zero for i=1 . . . 3 and j=1 . . . 3. The transverse coefficient dijj is expressed in Coulomb per Newton and can be respectively measured or obtained from tables for the chosen materials.

The transverse piezoelectric effect cannot be utilized if the material of the body 20 is chosen such that its transverse coefficient dijj is equal to zero.

In order to simultaneously measure the static pressure with the same measuring element 2, the piezoelectric body 20 is at the same time operated in the form of a thickness shear oscillator. In order to achieve this mode of operation, the electronic evaluation and excitation system 3 incites the piezoelectric body 20 to oscillate with a thickness shear oscillation frequency f.

Figure 2:
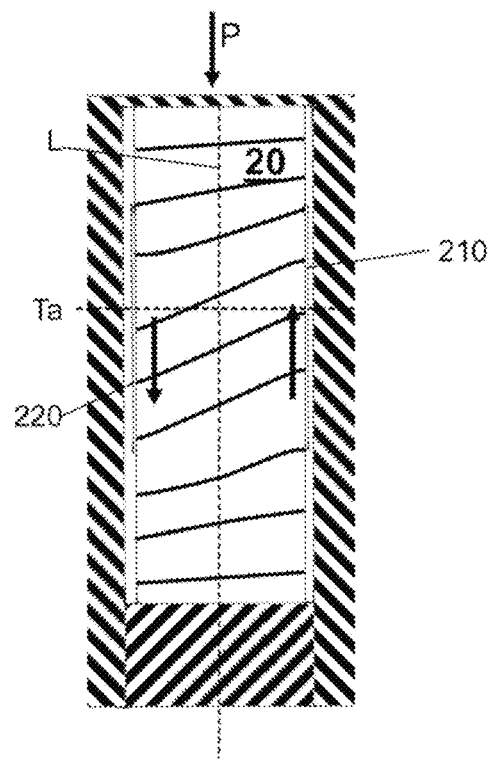
FIG. 2 shows a schematic section through the piezoelectric body during its operation in the form of a thickness shear oscillator, wherein the shearing in the body is also indicated in this figure.

FIG. 2 schematically shows the shearing action in the body 20 while thickness shear oscillations are incited by means of the first and the second lateral face electrodes 210, 220. In this case, the shearing action practically takes place in the region of the lateral face electrodes 210, 220 only and no shearing action or almost no shearing action occurs on the ends 23, 24. The thickness shear oscillation frequency f changes under the influence of a force F acting parallel to the longitudinal direction L, wherein the magnitude of the pressure P can be deduced from this frequency change. The body 20 is acted upon with an alternating voltage and thereby incited to carry out thickness shear oscillations with frequencies in the megahertz range, preferably between 0.5 and 100 MHz, such that it is operated in the form of a thickness shear oscillator.

The inverse piezoelectric effect is utilized in this second measuring mode, wherein this takes place simultaneously with the utilization of the direct piezoelectric effect.

In order to operate the body 20 or the piezoelectric material in the form of a thickness shear oscillator and to thereby utilize the inverse piezoelectric effect, the piezoelectric e-tensor eijk must have a thrust coefficient eiij other than zero for i=1 . . . 3 and j=1 . . . 3.

$$e_{ijk} = \frac{\partial D_i}{\partial S_{jk}} = -\frac{\partial T_{jk}}{\partial E_i}, i = 1 \ldots 3, j = 1 \ldots 3$$

In order to achieve the highest oscillation quality possible of the body 20 during its operation in the form of a thickness shear oscillator, the value of the thrust coefficient eiij of the piezoelectric e-tensor eijk should be as high as possible. If the value of the thrust coefficient eiij is zero, no thickness shear oscillation can be achieved and the body 20 therefore cannot be operated in the form of a thickness shear oscillator.

According to FIG. 1b, a body 20 with only lateral face electrodes 210, 220 can be used if a suitable piezoelectric material is chosen, wherein the piezoelectric transverse effect can be utilized and a thickness shear oscillation can be simultaneously generated due to an electric excitation of the body 20 by means of a connection between an electronic evaluation and excitation system 3 and the lateral face electrodes 210, 220 such that the inverse piezoelectric can likewise be utilized for respectively measuring or determining forces or pressures and/or the temperature.

The requirements with respect to the piezoelectric body 20 are the arrangement of the lateral face electrodes 210, 220, as well as the choice of a piezoelectric material, in which the piezoelectric e-tensor e has a thrust coefficient eiij other than zero and the piezoelectric d-tensor dijk additionally has a transverse coefficient dijj other than zero.

Figure 3A:
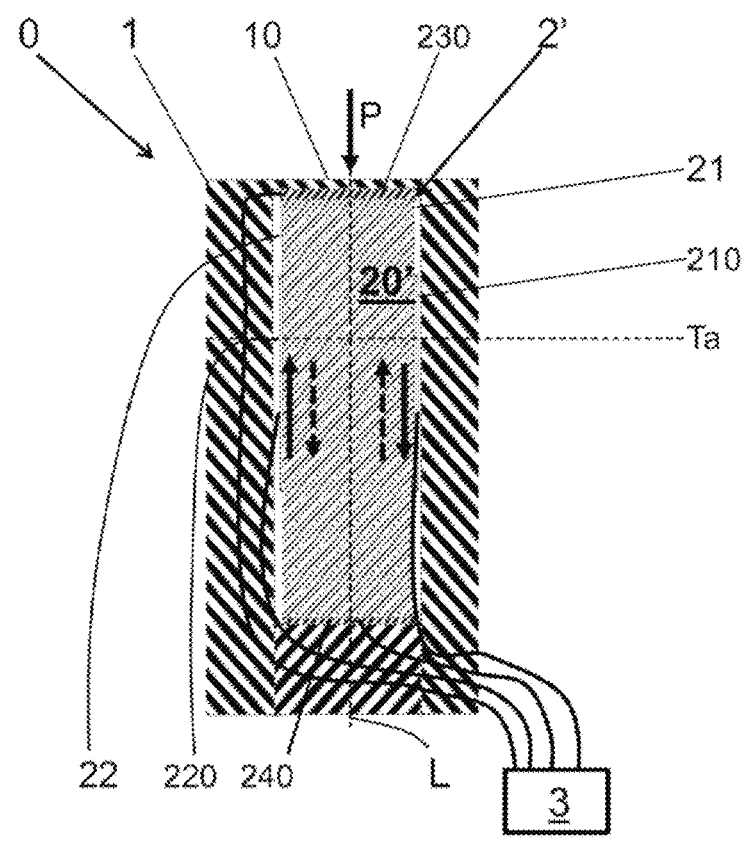

FIG. 3a shows a measuring element 2' that is arranged within a measuring element mounting 1 and features a body 20' having the direct piezoelectric effect in the longitudinal direction L. In this longitudinal effect, the direction of the force action and the direction of the charge transfer are identical. Accordingly, end face electrodes 230, 240 are in this case arranged on end faces 23, 24 that are spaced apart in the longitudinal direction L. The end face electrodes 230, 240 completely cover the end faces 23, 24 in this embodiment.

The end face electrodes 230, 240, as well as the lateral face electrodes 210, 220, are vapor-deposited onto the respective surfaces with conventional methods such as, for example, physical vapor deposition (PVD) or chemical vapor deposition (CVD). In this respect, it suffices to produce a closed electrode layer with minimal thickness.

In this embodiment, the electronic evaluation and excitation system 3 is connected to the end face electrodes 230, 240 and the lateral face electrodes 210, 220 via supply lines. Due to the longitudinal effect, a charge between the end face electrodes 230, 240 can be measured by the electronic evaluation and excitation system 3 via the supply lines under the influence of a force acting in the longitudinal direction L. If the body 20' is at the same time excited and operated in the form of a thickness shear oscillator, the inverse piezoelectric effect in the transverse direction Ta can also be simultaneously measured in the above-described fashion.

In this case, the requirements with respect to the piezoelectric body 20' are the arrangement of the lateral face electrodes 210, 220 and the end face electrodes 230, 240, as well as the choice of a piezoelectric material, in which the piezoelectric e-tensor eijk has a thrust coefficient eiij other than zero and the piezoelectric d-tensor dijk additionally has a longitudinal coefficient diii other than zero.

In order to achieve the highest oscillation quality possible of the thickness shear oscillator, the piezoelectric material or the body 20, 20' should respectively have an electromechanical coupling factor kiij$^2$ greater than or equal to 0.001, preferably greater than or equal to 0.01. In a piezoelectric material, the coupling factor kiij² represents the ratio of the stored mechanical energy to the consumed electrical energy.

Until now, the materials used in measuring elements employed separate bodies that were either optimized for the direct or for the inverse piezoelectric effect such that measuring elements with a plurality of bodies had to be used.

FIG. 3b shows an example of a measuring element 2' with a piezoelectric body 20' that has a longitudinal piezoelectric effect, wherein a first end face 23 and a second end face 24 are spaced apart from one another and arranged opposite of one another in the longitudinal direction L. The first end face 23 is provided with a first end face electrode 230 and the second end face 24 is provided with a second end face electrode 240. The end face electrodes 230, 240 are connected to a not-shown electronic evaluation and excitation system. An electric voltage can be tapped or charges can be measured between the end face electrodes 230, 240 under the influence of a force acting upon the body 20' in the longitudinal direction L. Since lateral face electrodes 210, 220 are in this case also arranged on lateral faces 21, 22 lying opposite of one another in the transverse direction Ta and the body 20' can likewise be operated in the form of a thickness shear oscillator, the inverse piezoelectric effect can in this case be utilized for the pressure measurement and/or temperature measurement simultaneously with the longitudinal effect.

In a slightly modified embodiment of the measuring element 2, 2' shown in FIG. 3c for example, the body 20, 20' features a special design of the electrodes. In this case, the first lateral face electrode 210 is conductively connected to the first end face electrode 230, wherein the connection is produced at the corner of the body 20, 20' that lies between the first lateral face 21 and the first end face 23. Accordingly, the second lateral face electrode 220 is conductively connected to the second end face electrode 240. This connection is produced at a corner of the body 20, 20' that lies between the second lateral face 22 and the second end face 24. The body 20, 20' may be chosen such that it has the inverse piezoelectric effect and selectively the transverse effect and/or the longitudinal effect.

A conductive connection between adjacent lateral face electrodes 210, 220 and end face electrodes 230, 240 is particularly advantageous if the body 20, 20' has the longitudinal effect or the transverse effect and should be operated in the form of a thickness shear oscillator. In this case, the electronic evaluation and excitation system 3 merely has to be connected to the body 20, 20' by means of two supply lines as shown in FIG. 3c for example.

Piezoceramics may be used as piezoelectric material for the body 20, 20' and chosen such that they meet the above-defined requirements in dependence on their intended use. Suitable piezoceramics are available in the form of a lead-zirconate-titanate (PZT, Pb[Zr$_x$Ti$_{1-x}$]O3, 0≤x≤1), a bismuth titanate or a lead-meta-niobate such as, for example, PbNb$_2$O$_6$.

However, piezoelectric materials in the form of monocrystalline materials such as, for example, tourmaline, lithium niobate (LiNbO3), lithium tantalate (LiTaO3), oxyborate in the form of ReCa4O(BO3)3 with Re in the form of rare earth (Y, Gd, La) or crystals belonging to the crystallographic space group P321, e.g. α-quartz (α-SiO2) or gallium orthophosphate, may also be used for the body 20, 20'. Other crystals of this space group have a crystalline structure analogous to langasite (La3Ga5SiO14) such as, for example, langatate (La3Ga5.5Ta0.5O14) or langanite (La3Ga5.5Nb0.5O14), Ca3Ga2Ge4O14, LaGa5GeO14, Ca3TaGa3SiO14, Ca3NbGa3SiO14, Sr3TaGa3SiO14 or Sr3NbGa3SiO14.

High-purity monocrystals can be grown or already are commercially available, wherein crystals that do not occur naturally, for example langasite, also can be purposefully grown. A purposeful preparation has to take place in order to meet the above-defined requirements with respect to piezoelectric bodies 20, 20' consisting of such monocrystals.

Figure 4A:
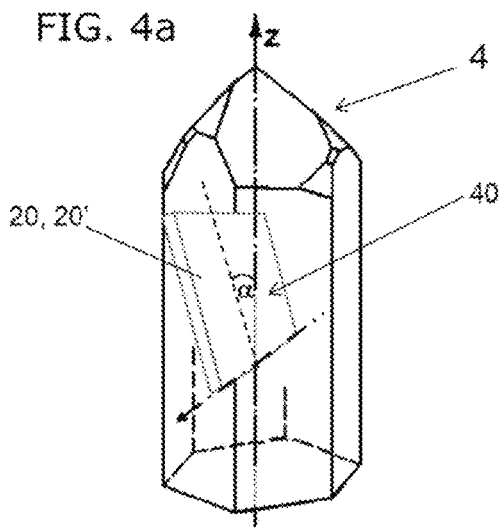

FIG. 4a schematically shows a quartz crystal 4 with a principal axis z, wherein the quartz crystal 4 is cut in a plane 40 that extends at a cutting angle α relative to the principal axis z of the quartz crystal 4. The cut-out piezoelectric body 20, 20' has different transverse coefficients dijj, longitudinal coefficients diii and thrust coefficients eiij depending on the choice of the angle α.

Figure 4B:
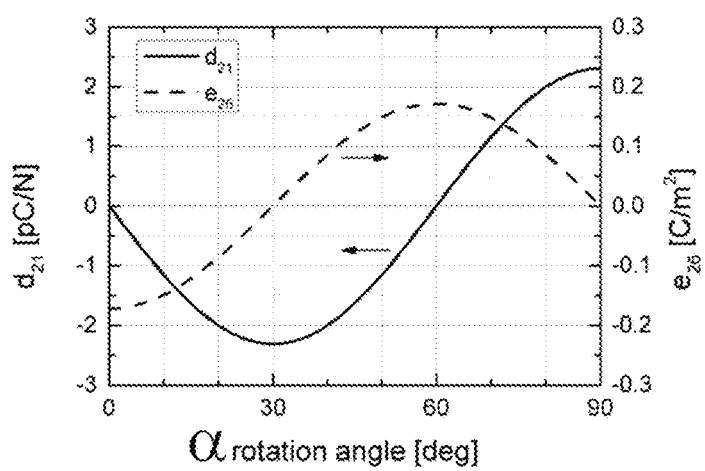
FIG. 4b shows the angular dependence of the thrust coefficient and the transverse coefficient on a cutting angle relative to the principal axis using the example of a quartz crystal.

FIG. 4b shows an exemplary diagram of a quartz crystal, wherein the corresponding angularly dependent transverse coefficient dijj and thrust coefficient eiij is respectively assigned to different cutting angles α relative to the principal axis z.

At 0° (or also at 60°), the coefficient e221 is maximal, wherein this is ideal for generating the thickness shear oscillation because the highest oscillation quality is achieved. Unfortunately, the coefficient d211 is zero such that no transverse effect exists. After a rotation by 30° (or also by 90°), the highest transverse sensitivity is reached because d211 is maximal, but the coefficient e221 is zero and no thickness shear oscillation is generated.

The requirement of both coefficients dijj, eiij being other than zero is met at cutting angles α between 5° and 25°, between 35° and 55° and between 65° and 85°. With respect to monocrystals, the piezoelectric body 20, 20' can be accordingly produced such that the conditions are met, a thickness shear oscillation with sufficient oscillation quality can be generated and the piezoelectric effect can simultaneously be utilized.

With respect to monocrystals, it is possible to find suitable angles α, at which the cut-out piezoelectric body 20, 20' has longitudinal coefficients diii other than zero and simultaneously thrust coefficients eiij other than zero. Consequently, piezoelectric bodies 20, 20' can be cut out of monocrystals in such a way that the desired piezoelectric properties are achieved.

The resonant frequency $f_R$ of a thickness shear oscillator primarily depends on the modulus of elasticity $c_{66}$, on the crystal density ρ and on the thickness d of the oscillator in accordance with the following formula:

$$f_R(T) = \frac{1}{2d(T)}\sqrt{\frac{c_{66}(T)}{\rho(T)}}$$

Figure 4C:
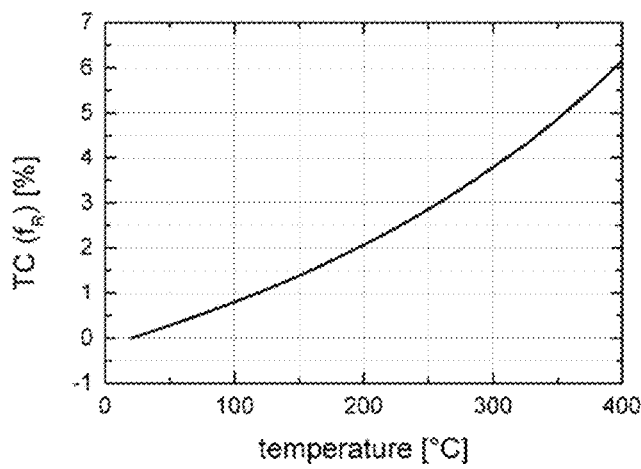
FIG. 4c shows the relative deviation of the resonant frequency $TC(f_R)$ in dependence on the temperature using the example of quartz.

The modulus of elasticity $c_{66}$, the crystal density ρ and the thickness are dependent on the temperature T such that the resonant frequency shifts when the temperature of the oscillator changes. The temperature can therefore be calculated based on the determination of the resonant frequency of the thickness shear oscillator. The relative deviation of the resonant frequency TC($f_R$) in dependence on the temperature is illustrated in FIG. 4c using the example of quartz.

If the modulus of elasticity $c_{66}$ also depends on the mechanical stresses, the formula for the resonant frequency $f_R$ can be expanded:

$$f_R(T, F) = \frac{1}{2d(T)}\sqrt{\frac{c_{66}(T, F)}{\rho(T)}},$$

wherein F is the force acting upon the thickness shear oscillator. Consequently, a force can also be calculated based on the determination of the resonant frequency. This principle is used, for example, with the AT-cut of the quartz oscillator in order to manufacture force sensors. It is naturally also possible to evaluate harmonics of the thickness shear oscillations in order to determine the force or pressure or temperature.

REFERENCE LIST

0 Sensor structure
1 Measuring element mounting
10 Diaphragm
11 Abutment
2 Measuring element
20 Body (piezocrystal or piezoceramic)
21 First lateral face
210 First lateral face electrode
22 Second lateral face
220 Second lateral face electrode
23 First end face
230 First end face electrode
24 Second end face
240 Second end face electrode
Ta Transverse direction
L Longitudinal direction
d Piezoelectric d-tensor (tensor of the third order)
dijj Transverse coefficient
diii Longitudinal coefficient
e Piezoelectric e-tensor
eiij Thrust coefficient
kiij Electromechanical coupling factor
D Vector of electric displacement field
T Stress tensor
S Strain tensor
E Vector of electric field
l Length
a Thickness
b Width
F Force
P Pressure
f Thickness shear oscillation frequency
3 Electronic evaluation and excitation system
4 Quartz crystal
40 Cutting plane
z Principal axis
α Cutting angle relative to principal axis

The invention claimed is:

1. A measuring element for disposition in a measuring element mounting pre-stressed along a longitudinal axis for measuring at one opposite end of the longitudinal axis a dynamic pressure, temperature and/or static pressure, comprising:
   a body made of a piezoelectric material and defining a longitudinal axis, wherein the body has lateral faces that are arranged opposite of one another in a transverse direction relative to the longitudinal axis of the body and on each lateral face at least one electrode is arranged,
   wherein the piezoelectric e-tensor (eijk) of the piezoelectric material has a thrust coefficient (eiij) other than zero (with i (i=1 . . . 3) and j (j=1 . . . 3)) such that the inverse piezoelectric effect can be utilized during the operation of the measuring element as a thickness shear oscillator and
   wherein the piezoelectric material has a piezoelectric d-tensor (dijk) that has at least one of a transverse coefficient (dijj) other than zero (with i (i=1 . . . 3) and j (j=1 . . . 3)) and a longitudinal coefficient (diii) other than zero (with i (i=1 . . . 3) and j (j=1 . . . 3)) such that the transverse piezoelectric effect in the transverse direction and/or the longitudinal piezoelectric effect in the longitudinal direction can be utilized simultaneously with the inverse piezoelectric effect of the body.

2. The measuring element according to claim 1, wherein the piezoelectric material of the body is chosen such that the electromechanical coupling factor ($kiij^2$) is greater than or equal to 0.01.

3. The measuring element according to claim 2, wherein the piezoelectric material of the body is a piezoceramic in the form of one of a lead-zirconate-titanate (PZT, Pb[$Zr_x Ti_{1-x}$]O3, 0≤x≤1), a bismuth-titanate or a lead-meta-niobate.

4. The measuring element according to claim 1, wherein the piezoelectric body is cut out of a piezoelectric monocrystal, wherein the cutting plane is oriented along such a cutting angle (.alpha.) relative to the principal axis (z) of the piezoelectric monocrystal that the resulting body has the thrust coefficient (eijj), the transverse coefficient (dijj) and/or the longitudinal coefficient (diii) other than zero.

5. The measuring element according to claim 1, wherein the piezoelectric material is a monocrystalline piezoelectric material selected from the group consisting of tourmaline, LiNbO3, LiTaO3 and an oxyborate in the form of ReCa4O(BO3)3 with Re in the form of rare earth (Y, Gd, La).

6. The measuring element according to claim 1, wherein the piezoelectric material is a monocrystalline piezoelectric material belonging to the crystallographic space group P321 selected from the group consisting of quartz and GaPO4.

7. The measuring element according to claim 1, wherein the piezoelectric material is a crystal selected from the group consisting of La3Ga5.5Ta0.5O14, La3Ga5.5Nb0.5O14, Ca3Ga2Ge4O14, La3Ga5Ge0.5O14, Ca3TaGa3SiO14, Ca3NbGa3SiO14, Sr3TaGa3SiO14, Sr3NbGa3SiO14, Ca3Ga2Ge4O14 and Sr3Ga2Ge4O14.

8. The measuring element according to claim 1, wherein the piezoelectric material of the body is a piezoceramic in the form of one of a lead-zirconate-titanate (PZT, Pb[$Zr_x Ti_{1-x}$]O3, 0≤x≤1), a bismuth-titanate or a lead-meta-niobate.

9. The measuring element according to claim 1, wherein the body includes end face electrodes on end faces that are arranged opposite of one another in the longitudinal direction (L), wherein said end face electrodes are configured to be connected to an electronic evaluation and excitation system via supply lines such that the longitudinal effect can be measured at the end face electrodes and the inverse piezoelectric effect can be simultaneously incited and measured at the lateral face electrodes.

10. The measuring element according to claim 9, wherein the first lateral face electrode is conductively connected to a first one of the end face electrodes and the second lateral face electrode is conductively connected to a second one of the end face electrodes such that the measuring element only needs to be connected to an electronic excitation system by means of two supply lines in order to operate the measuring element.

11. A sensor structure comprising a measuring element mounting, in which a measuring element according to claim 1 is clamped in a functionally connected fashion, wherein the measuring element is configured to be connected to an electronic evaluation and excitation system and the inverse piezoelectric effect can be simultaneously utilized in addition to the piezoelectric effect.

12. The sensor structure according to claim 11, wherein the electronic excitation system is configured to be connected to the measuring element by means of two supply lines, namely at a first one of the lateral face electrodes that is conductively connected to a first end face electrode and at a second one of the lateral face electrodes that is conductively connected to a second end face electrode.

13. The measuring element according to claim 1, wherein the piezoelectric material has the piezoelectric d-tensor that has the transverse coefficient other than zero (with i (i=1 ... 3) and j (j=1 ... 3)) and the longitudinal coefficient other than zero (with i (i=1 ... 3) and j (j=1 ... 3)) such that the transverse piezoelectric effect in the transverse direction and/or the longitudinal piezoelectric effect in the longitudinal direction can be utilized simultaneously with the inverse piezoelectric effect of the body.

14. A method for measuring the static and dynamic pressure and/or the temperature with a measuring element according to claim 1 that has its piezoelectric body clamped in a measuring element mounting in the longitudinal direction (L), the method comprising the following steps:
the measuring element is functionally connected to an electronic evaluation and excitation system via supply lines,
wherein the measuring element is operated in the form of a thickness shear oscillator that is electronically incited to oscillate with a thickness shear oscillation frequency by means of the electronic evaluation and excitation system,
wherein frequency deviations due to external forces are used for determining the static pressure, and
measuring, at the same time that the measuring element is operated in the form of the thickness shear oscillator, the direct piezoelectric effect in the transverse direction or the longitudinal direction in order to determine the dynamic pressure.

15. The method according to claim 14, wherein the temperature is determined from the frequency deviations.

16. The method according to claim 14, wherein the direct piezoelectric effect in the longitudinal direction (L) is measured and used to determine the dynamic pressure.

17. The method according to claim 16, wherein the temperature is determined from the frequency deviations.

18. The method according to claim 14, wherein the direct piezoelectric effect is measured in the longitudinal direction and used to determine the dynamic pressure.

19. The method according to claim 18, wherein the temperature is determined from the frequency deviations.

* * * * *